United States Patent
Ficici et al.

(10) Patent No.: US 9,385,697 B2
(45) Date of Patent: Jul. 5, 2016

(54) METHOD AND APPARATUS FOR CANCELLATION OF SPURIOUS SIGNALS

(71) Applicant: Entropic Communications, LLC, Carlsbad, CA (US)

(72) Inventors: Ali Murat Ficici, San Diego, CA (US); Chi-ping Nee, Santee, CA (US); Branislav Petrovic, La Jolla, CA (US)

(73) Assignee: Maxlinear, Inc., Carlsbad, CA (US)

( * ) Notice: Subject to any disclaimer, the term of this patent is extended or adjusted under 35 U.S.C. 154(b) by 99 days.

(21) Appl. No.: 14/297,344

(22) Filed: Jun. 5, 2014

(65) Prior Publication Data
US 2015/0295566 A1 Oct. 15, 2015

Related U.S. Application Data

(60) Provisional application No. 61/979,862, filed on Apr. 15, 2014.

(51) Int. Cl.
*H03B 1/00* (2006.01)
*H03K 5/00* (2006.01)
*H03K 5/1252* (2006.01)

(52) U.S. Cl.
CPC .................................. *H03K 5/1252* (2013.01)

(58) Field of Classification Search
CPC ..... G06F 1/0328; G06F 1/0321; G06F 1/0342; G06F 2211/902
See application file for complete search history.

(56) References Cited

U.S. PATENT DOCUMENTS

| 8,433,737 B1 | 4/2013 | Kintigh | |
| 2002/0150169 A1* | 10/2002 | Kishi | H03D 7/166 375/295 |

OTHER PUBLICATIONS

PCT, Notification of Transmittal of the International Search Report and the Written Opinion of the International Searching Authority, or the Declaration, in international application No. PCT/US15/25718 dated Jul. 23, 2015 (19 pages).

* cited by examiner

*Primary Examiner* — Lincoln Donovan
*Assistant Examiner* — Diana J Cheng
(74) *Attorney, Agent, or Firm* — McAndrews, Held & Malloy, Ltd.

(57) ABSTRACT

Systems and methods for generating a spurious signal cancellation signal, the system comprising two direct digital synthesizers (DDS). The first DDS provides phase tracking to correct for rounding errors. The second DDS outputs a frequency that is exactly equal to N/M*CLK, where N and M are values selected to set the output frequency equal to the frequency of a spurious signal to be cancelled, and CLK is a clock frequency used to clock the first and second DDS circuits.

14 Claims, 8 Drawing Sheets

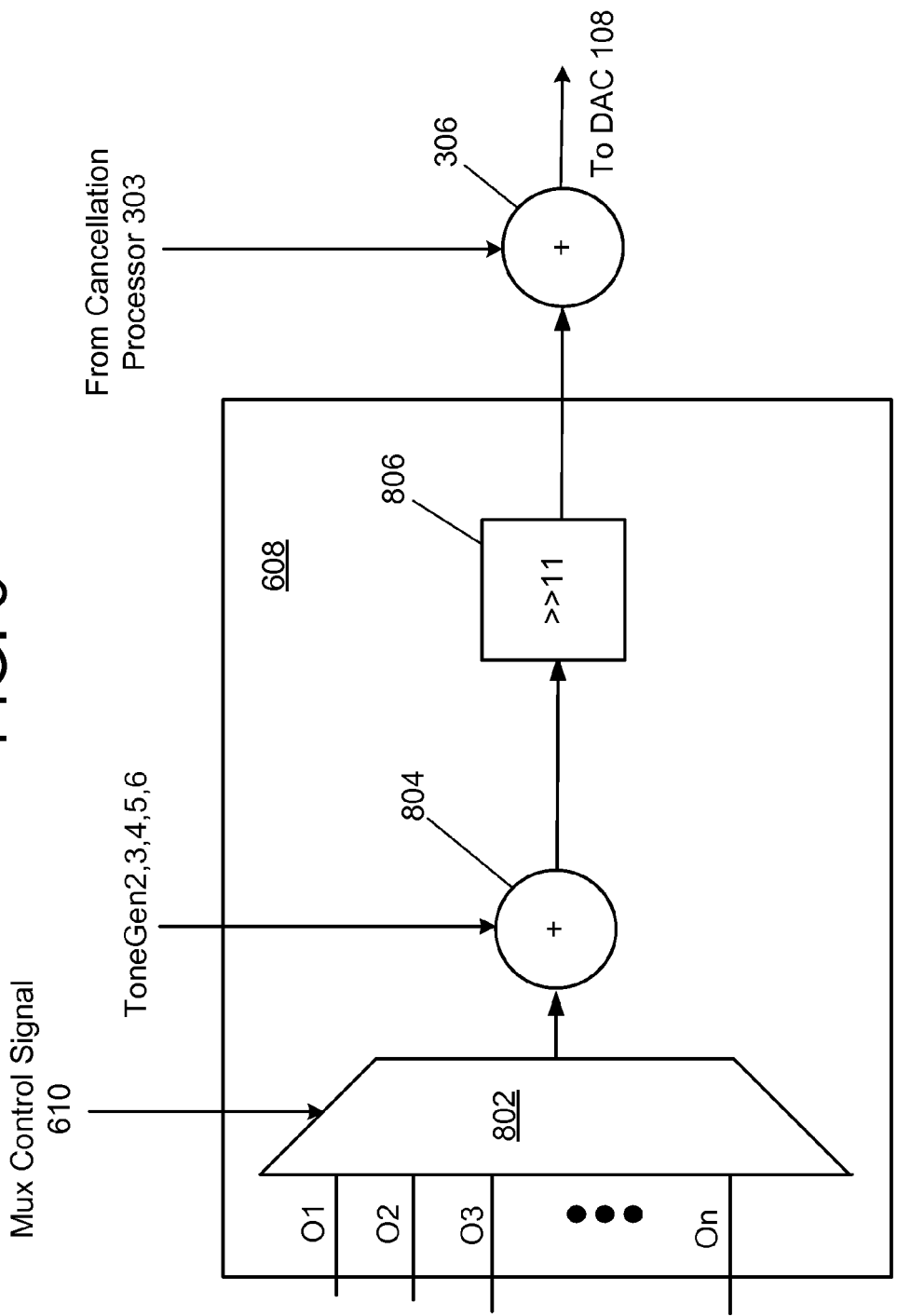

METHOD AND APPARATUS FOR CANCELLATION OF SPURIOUS SIGNALS

RELATED APPLICATIONS

This application claims priority benefit of U.S. Provisional Patent Application Ser. No. 61/979,862, filed Apr. 15, 2014 and entitled "Method and Apparatus for Cancellation of Spurious Signals", which is herein incorporated by reference in its entirety.

TECHNICAL FIELD

The disclosed method and apparatus relate to communications systems and more particularly to reducing spurious signals generated within a transmitter of a communications system.

BACKGROUND

Many transmitters used in communications systems today have several functions packaged together within a system on a chip (SoC). Having several functions performed within the same SoC means that there will be several clock signals having frequencies that get coupled to, and interfere with, other circuits within the IC. These clocks may be used in phase lock loops that clock processor functions or are used for modulating signals to be transmitted, etc. Accordingly, signal contamination occurs as a consequence of various signals on the SoC die, SoC substrate package, printed circuit board upon which the SoC is mounted, etc.

FIG. 1 is a simplified block diagram of a transceiver 100 having a digital signal processor (DSP) for mitigating the effects of spurious signals. A digital core 102 communicates via a port 104 connected to external devices or memory devices (not shown) in accordance with one or more protocols or network interfaces, such High-Definition Multimedia Interface (HDMI), Universal Serial Bus (USB), Ethernet, Double Data Rate (DDR), Flash, Reduced Gigabit Media Independent Interface (RGMII), etc. The digital core 102 provides signals to be transmitted to a mitigation DSP 106. The mitigation DSP 106 attempts to reduce the effects of spurious signals that are coupled to the signal to be transmitted.

Once the mitigation DSP 106 has processed the signal to reduce spurious signals generated within the digital core 102, the signals are coupled to a digital to analog converter (DAC) 108. The DAC 108 receives the signal in digital format and outputs an analog signal that can be transmitted. The analog output from the DAC 108 is coupled to a filter 110 to remove any distortion created by the DAC 108 or other out of band energy. The output of the filter 110 is coupled to a power amplifier (PA) 112. The PA 112 amplifies the signal for transmission. A receive/transmit switch 114 is set to transmit mode. In transmit mode, the switch 114 couples the output of the PA 112 to a diplexer 116. The diplexer 116 routes the output of the PA 112 to the medium 118 over which the signal is to be transmitted, such as a coaxial cable or antenna.

When the switch 114 is in the receive position, signals received over the medium 118 are routed from the diplexer 116 to a low noise amplifier (LNA) 120. The output of the LNA 120 is coupled to a filter 122 that removes out of band energy. The output of the filter 122 is coupled to an analog to digital converter (ADC) 124. The output of the ADC 124 is coupled to the mitigation DSP 106. The mitigated signals is then coupled to the digital core 102, which outputs the signals to the port 104.

The transceiver 100 shown in FIG. 1 also has a receive leg 126 for receiving satellite or cable television signals.

One common technique for mitigating interference and reducing the effects of spurious signals is to using narrowband notch filters that reject signals that have a frequency equal to that of the interfering spurious signal. Such filters are difficult to build, since they need to be very narrow and selective. Another common technique is to use an adaptive filter to cancel transmission energy that can leak into the receive path. Yet another technique is to inject an out of phase signal that has a frequency and amplitude that is equal to the spurious signal to be cancelled.

There are several techniques for generating a signal that is 180 degrees out of phase with a spurious signal to be cancelled. These techniques are complex and expensive. Therefore, there is a need for a technique for mitigating the effects of spurious signals that can interfere with transmission signals generated within an SoC.

SUMMARY

A method and apparatus are disclosed for generating signals that are equal in frequency and amplitude to spurious signals and that are 180 degrees output phase. A direct digital synthesizer DDS is used to generate a broadband tone that is equal to N/M times a clock frequency, where N and M are values that are maintained in a register within the DDS. The exact frequency and amplitude are determined by analyzing the output of the transmitter with a spectrum analyzer. Alternatively, an iterative process can be used to determine when the spurious signals are reduced and feed that information back to the DDS. The phase can be determined by sweeping the phase of the generated tone and observing the spurious signal to be cancelled to detect when the spurious signal has been cancelled. In one embodiment, a loopback mode is used to allow the receiver within the transceiver to detect the frequency and amplitude of spurious signals to be cancelled and also to provide feedback for detecting when the phase, frequency and amplitude of the tones generated by the DDS are properly set to most effectively cancel the spurious signals of interest.

The DDS is then used to generate a tone that is of equal frequency and amplitude and opposite in phase. The generated tone is then used to cancel the spurious signal. Several interleaved legs are used to increase the sampling frequency of the generated tone. In addition, several tones can be generated to enable the cancellation of several spurious signals.

The DDS has two phase accumulators. The two accumulators are used in order to generate a cancelling tone at a frequency of exactly N/M*CLK. The first phase accumulator is used for phase tracking to correct for any rounding errors that would typically occur in a single accumulator architecture. The second phase accumulator generates a tone having a frequency that is exactly equal to N/M*CLK at the output of the DDS.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

FIG. 8 is a simplified block diagram of the multiplexer.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 1:
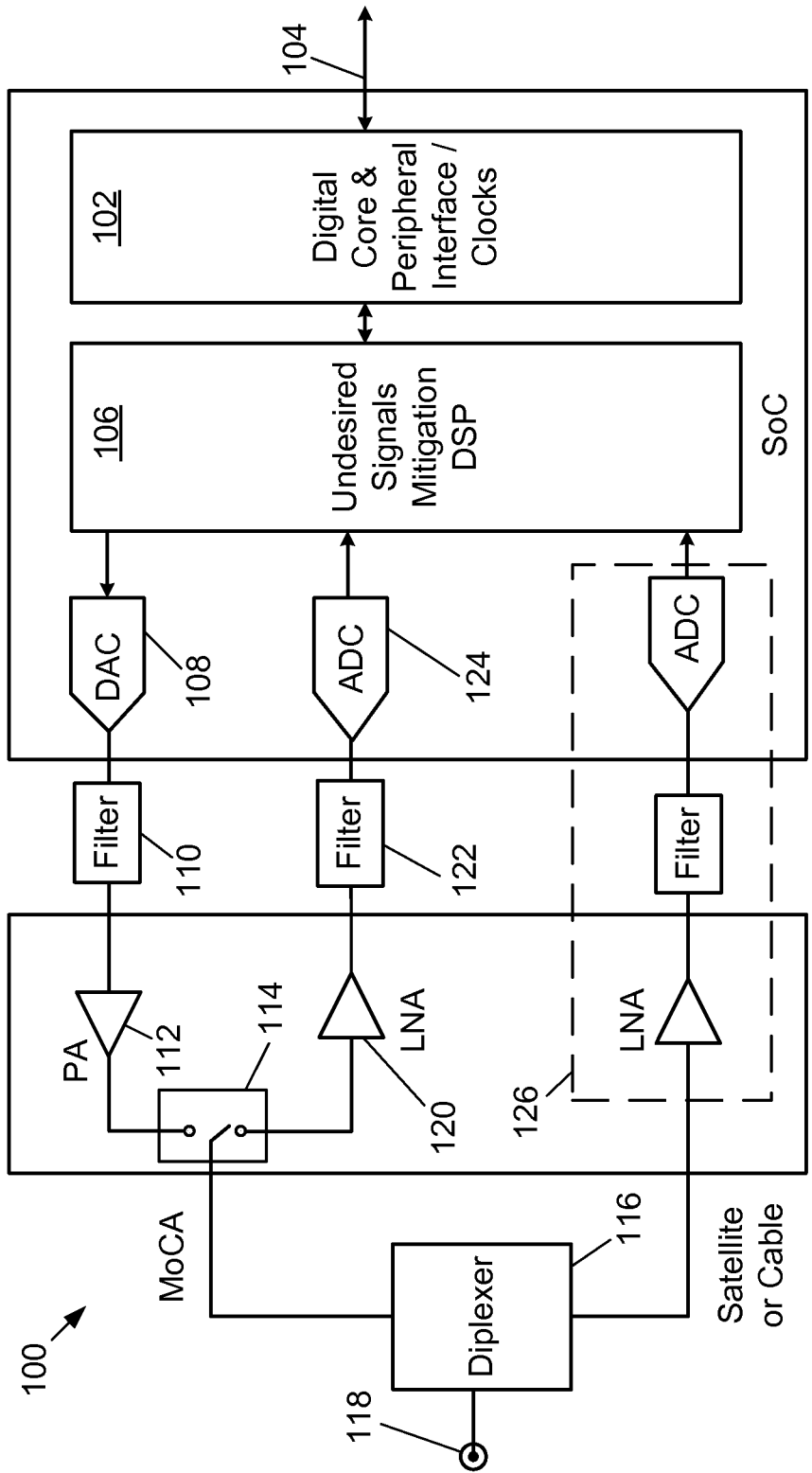
FIG. 1 is a simplified block diagram of a transceiver having a digital signal processor for mitigating the effects of spurious signals.
Figure 2:
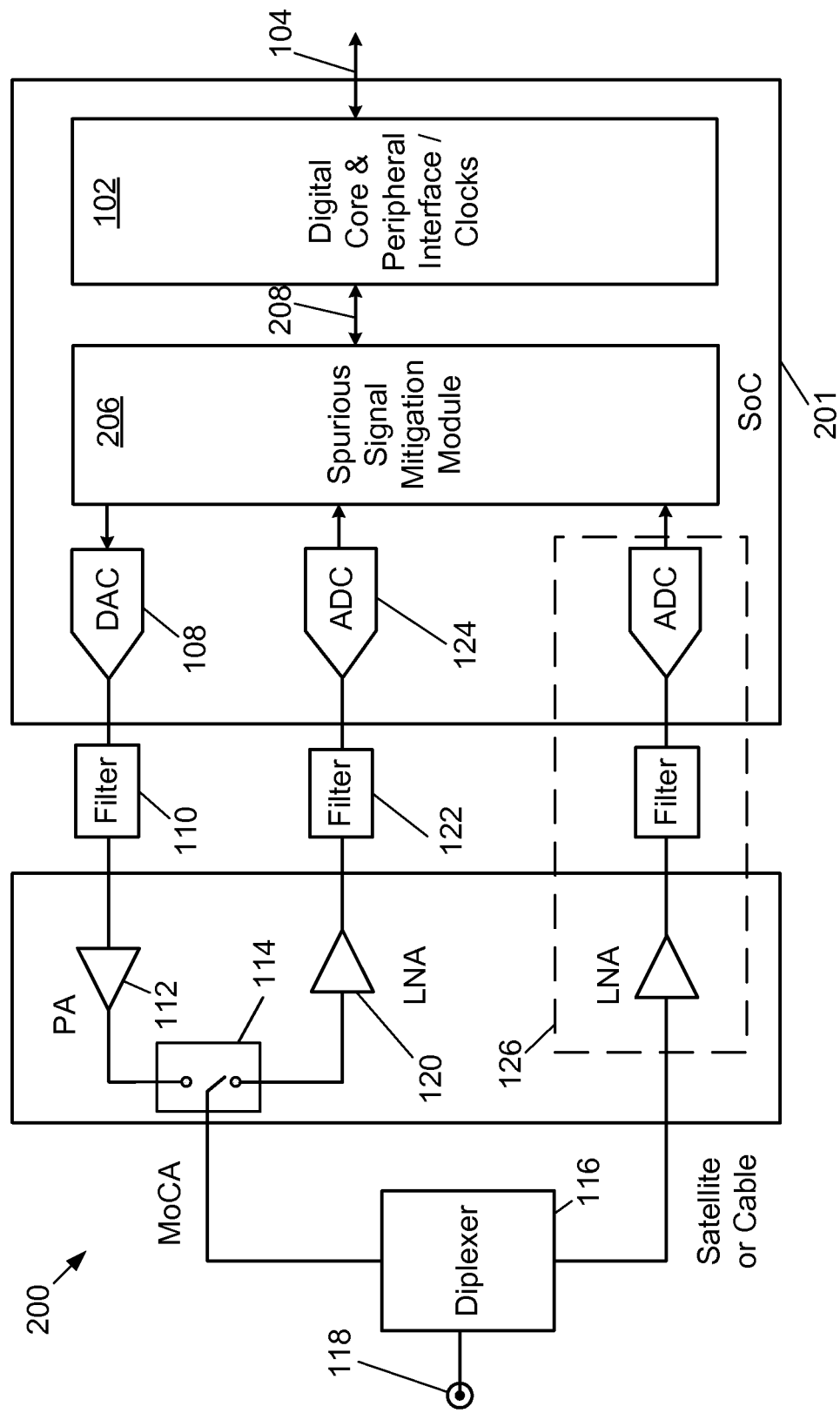
FIG. 2 is a simplified block diagram of a transceiver having a spurious signal mitigation module in accordance with the presently disclosed method and apparatus.

FIG. 2 is a simplified block diagram of a transceiver 200 having a system on a chip (SoC) 201. The SoC 201 has a spurious signal mitigation module 206 in accordance with the presently disclosed method and apparatus. The transceiver 200 operates essentially the same as the transceiver 100 described above. However, the transceiver 200 has a spurious signal mitigation module 206 that differs from the undesired signals mitigation DSP 106 used in the transceiver 100. The digital core 102 within the SoC 201 communicates via a port 104 connected to external devices or memory devices (not shown) in accordance with one or more protocols or network interfaces, such High-Definition Multimedia Interface (HDMI), Universal Serial Bus (USB), Ethernet, Double Data Rate (DDR), Flash, Reduced Gigabit Media Independent Interface (RGMII), etc. The digital core 102 provides signals to be transmitted to the module 206 via a signal path 208. The module 206 attempts to reduce the effects of spurious signals that are coupled to the signal to be transmitted.

Once the module 206 has processed the signal to reduce spurious signals generated within the digital core 102, the signals are coupled to a digital to analog converter (DAC) 108. The DAC 108 receives the signal in digital format and outputs an analog signal that can be transmitted. The analog output from the DAC 108 is coupled to a filter 110 to remove any distortion created by the DAC 108 or other out of band energy. The output of the filter 110 is coupled to a power amplifier (PA) 112. The PA 112 amplifies the signal for transmission. A receive/transmit switch 114 is set to transmit mode. In transmit mode, the switch 114 coupled the output of the PA 112 to a diplexer 116. The diplexer 116 routes the output of the PA 112 to the medium 118 over which the signal is to be transmitted, such as a coaxial cable or antenna.

When the switch 114 is in the receive position, signals received over the medium 118 are routed from the diplexer 116 to a low noise amplifier (LNA) 120. The output of the LNA 120 is coupled to a filter 122 that removes out of band energy. The output of the filter 122 is coupled to an analog to digital converter (ADC) 124. The output of the ADC 124 is coupled to the mitigation DSP 106. The mitigated signals are then coupled to the digital core 102, which outputs the signals to the port 104.

The transceiver 200 shown in FIG. 2 also has a receive leg 126 for receiving satellite or cable television signals.

Figure 3:
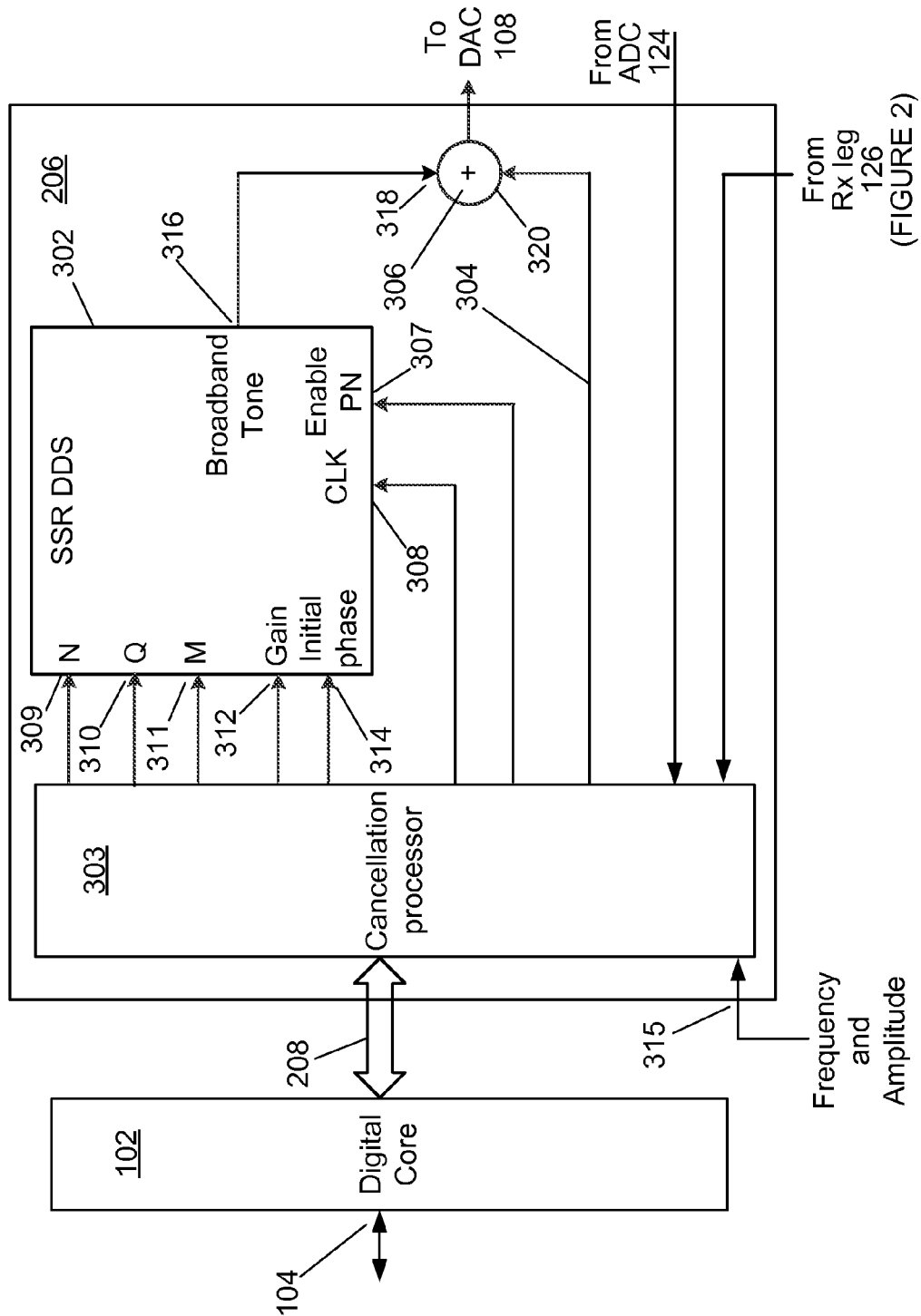
FIG. 3 is a simplified block diagram of the spurious signal mitigation module in accordance with one embodiment of the presently disclosed method and apparatus.

FIG. 3 is a simplified block diagram of the spurious signal mitigation module 206 in accordance with one embodiment of the presently disclosed method and apparatus. The module 206 includes a spurious signal rejection (SSR) direct digital synthesizer (DDS) 302, a cancellation processor 303 and a summer 306. As noted above with regard to FIG. 2, the digital core 102 provides digital signals to be transmitted to the module 206 via a signal path 208. In one embodiment in which the spurious signal mitigation module 206 is used in a set top box, the signals are home networking communication signals, such as MoCA network signals. The signals to be transmitted are received within the module 206 by the cancellation processor 303.

In accordance with one embodiment of the disclosed method and apparatus, the cancellation processor 303 analyzes the signal to be transmitted to determine the frequency and amplitude of any spurious signals that are present in the signal. In one such embodiment, this analysis can be done by looping back signals to be transmitted. The signals are looped back through the receive/transmit switch 114 (shown in FIG. 2). The signals are then received in the module 206. In one embodiment, the signals are analyzed within the cancellation processor 303 within the module 206. In an alternative embodiment, the signals are passed through the cancellation processor to the digital core 102 for analysis. In this case, the digital core 102 provides the results of the analysis to the cancellation processor 303 within the module 206.

In yet another alternative embodiment, the loop back signals are coupled directly from the ADC 124 to the digital core 102 for analysis. In this case, the digital core 102 provides the results of the analysis to the cancellation processor 303 within the module 206. In yet another embodiment, the analysis can be done externally and the results of the analysis provided to the cancellation processor 303. For example, test equipment (not shown) can be connected to the output 118 of the diplexer 116 (see FIG. 2). Such test equipment can include a spectrum analyzer that is used to determine the frequency and amplitude of any spurious signals that need to be cancelled. The frequency and amplitude of the spurious signals can then be directly communicated to the cancellation processor 303 through a calibration port 315. In yet another alternative embodiment, an initial estimate of the spurious signals to be cancelled can be made by external test equipment. Initial parameters are provided to the cancellation processor 303. Once the system is in an operational environment, the signals can be looped back to provide a more accurate determination of the frequency and amplitude of any spurious signals to be cancelled.

Once the cancellation processor 303 has information regarding the frequency and amplitude of any spurious signals to be cancelled, the cancellation processor 303 determines a set of cancellation parameters. The cancellation parameters are coupled to the SSR DDS 302. Operation of the SSR DDS 302, including the way each cancellation parameter is used by the SSR DDS 302, is discussed in detail further below.

In accordance with one embodiment of the disclosed method and apparatus, the SSR DDS 302 has seven input ports 307, 308, 309, 310, 311, 312, 314 and an output port 316, 317. The first input port 307 receives an initial phase/phase offset select signal.

The second port 308 receives a clock. In one embodiment of the disclosed method and apparatus, the clock runs at a constant frequency significantly higher than the frequency of the signals to be cancelled. Alternatively, the frequency of the clock may be variable under control of the cancellation processor 303.

In accordance with one embodiment, the third input port 309 receives the first of the five cancellation parameters. The first parameter is referred to as "N". N is one of two parameters used to generate the frequency of the spurious signal to be cancelled.

The fourth input port 310 receives the second parameter referred to as "M". N and M are selected such that an equality (N/M times the clock frequency equals $f_{Spur}$) is true, where $f_S$ is the frequency of the spurious signal to be cancelled. Accordingly: N/M*CLK=$f_{Spur}$. The parameters N and M can each be any integer value, provided M is at least twice N (i.e., for the SSR DDS 302, the sample frequency is equal to the CLK frequency and must be at least twice the frequency $f_{Spur}$ in order to meet the Nyquist criteria). However, as will be described in more detail below, by interleaving several branches, the sample frequency is increased (i.e., if 8 branches are used, then 8 samples are generated every clock cycle and the sample frequency is 8*CLK).

The third cancellation parameter is received through the fifth input port 311 to the SSR DDS 302. The third parameter is referred to as "Q". The value of Q is determined by the equation: Q=floor ((N/M)*Z): wherein Z is a parameter that determines a phase step size. As will be discussed in more detail below, Z is a hardware related parameter, and thus is not one of the five cancellation parameters controlled by the cancellation processor 303.

The fourth cancellation parameter is coupled to the sixth input port 312. The fourth parameter is a gain parameter. The gain parameter indicates the amplitude of the unwanted spurious signal. The amplitude of the signal to be generated should be such that, when measured at the output of the transmitter, it is equal to the amplitude of the unwanted spurious signal to be cancelled (with a 180 degree phase shift).

The fifth cancellation parameter is coupled to the seventh input port 314. The fifth parameter is an initial phase estimate. Since the signal generated by the SSR DDS 302 must be 180 degrees out of phase with respect to the spurious signal to be cancelled, an initial estimate of the phase of the spurious signal will assist in reducing the time required to establish the desired phase of the signal generated by the SSR DDS 302.

In one embodiment of the disclosed method and apparatus, the output port 316 couples the generated signal to a first input 318 of the summer 306. The output signal 304 to be transmitted is coupled to a second input 320 of the summer 306. The signal 304 still has the spurious signals to be cancelled present. Accordingly, summing the signal generated by the SSR DDS 302 with the output 304 will cause the unwanted spurious signal to be cancelled. The cancellation occurs due to the amplitude and frequency of the signal generated by the SSR DDS 302 being equal to the amplitude and frequency of the unwanted spurious signal and the phase being 180 degrees out of phase with the unwanted spurious signal.

In an alternative embodiment of the disclosed method and apparatus, the cancellation processor 303 provides only the value of N, the gain and the initial phase to the SSR DDS 302. In accordance with this embodiment, the value of M and Q are set within the SSR DDS 302 as fixed values.

Figure 4:
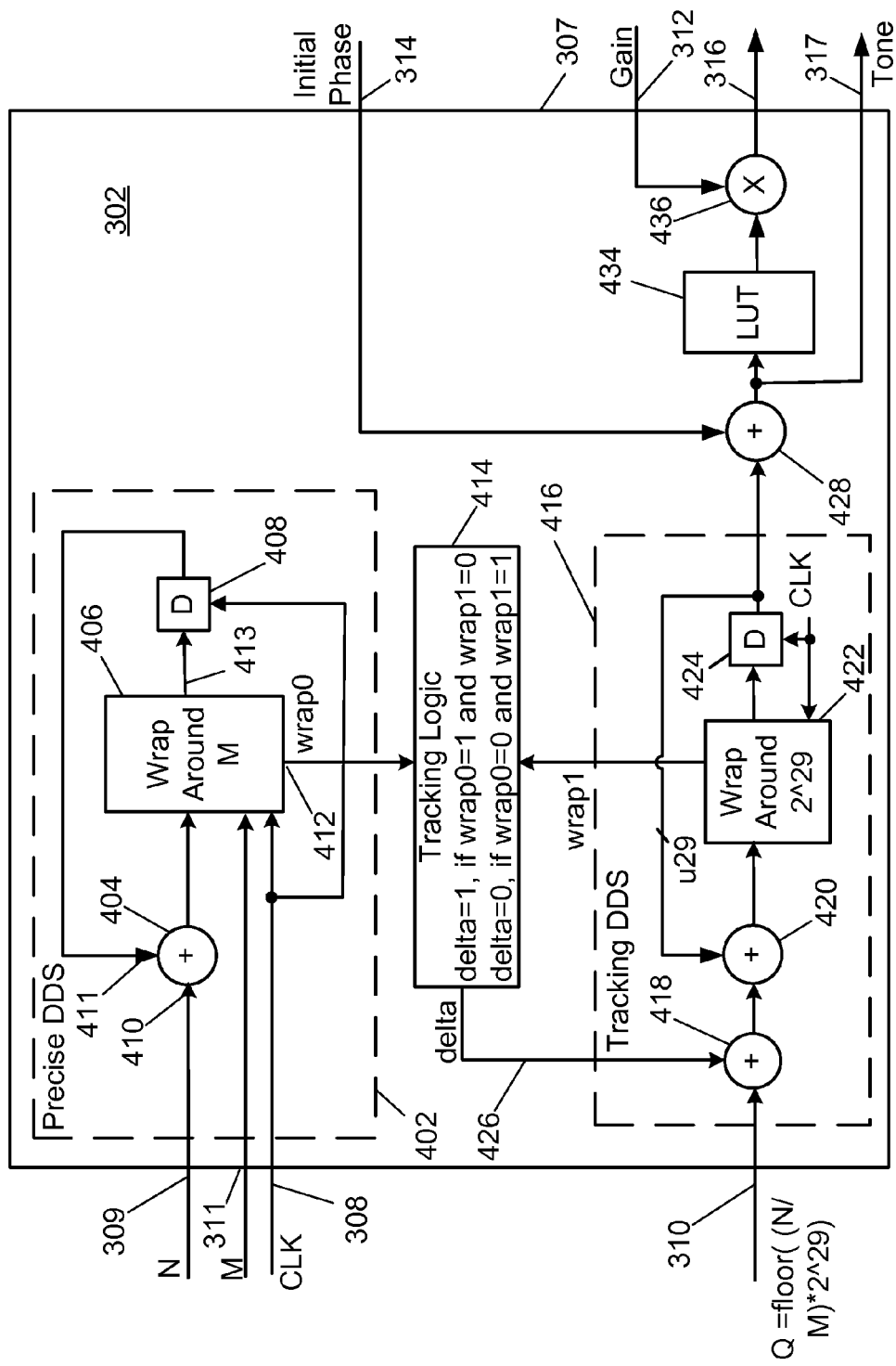
FIG. 4 is a simplified schematic diagram of an SSR DDS in accordance with one embodiment of the disclosed method and apparatus.

FIG. 4 is a simplified schematic diagram of an SSR DDS 302 in accordance with one embodiment of the disclosed method and apparatus. A first DDS circuit 402 provides phase tracking. The first DDS circuit includes a summer 404, a modulo-M counter 406 and an output register 408. In one embodiment of the disclosed method and apparatus, the value N can be held in a register (not shown) coupled to a first input 410 of the summer 404. The summer 404, the modulo M counter 406 and the output register 408 each have x bits, where $2^x$=M. Initially, the register 408 is set to zero. Therefore, on the first clock cycle, an output of zero is summed with N. This value is coupled to the input of the counter 406. On the next clock cycle, the value N is output from the register 408 to the second input 411 of the summer 404. Therefore, the output of the summer 404 is N+N=2*N. Since the counter 406 operates in modulo M, this process will continue until the value Y*N is greater than M, where Y is the number of clock cycles required to increment the output of the summer to a value equal to or greater than M. At that time, the counter 406 will wrap around. A "wrap0" output signal 412 is output from the counter 406. The output 413 from the counter 406 will then be $MOD_M$ (Y*N). This value will then be added to N in the next cycle. That is, after the counter 406 wraps around, any remainder will be output to the register 408 and then summed in the summer 404 with the value N applied to the input 410 of the summer 404. The process continues until the value output from the summer 406 again exceeds the value M. Each time the value of the counter 406 passes the value M, the wrap0 output 412 will output a "1". The wrap0 output 412 is coupled to the input of a tracking logic module 414. Accordingly, the first DDS circuit 402 provides phase tracking by advancing the phase of a second DDS circuit 416 as appropriate to correct for rounding errors that would otherwise occur.

The phase tracking provided by the first DDS circuit 402 allows the second DDS circuit 416 to generate a tone having a frequency that is exactly equal to N/M*CLK. The second DDS circuit 416 includes a first summer 418, a second summer 420, a modulo-$2^x$ counter 422, and a register 424. In the example shown in FIG. 4, x=29. Because, x=29 in accordance with the embodiment shown in FIG. 4, the first summer 418, the second summer 420, the modulo-$2^x$ counter 422, and the register 424 each handle 29 bits.

The operation of the second DDS circuit 416 is as follows. The value Q is coupled to the input to the first summer 418. The value Q=Floor (N/M*x)=Floor (N/M*$2^{29}$). The "Floor" function truncates the value to an integer. In accordance with one embodiment of the disclosed method and apparatus, since N, M and x are all set values (values that are known within the SSR DDS 320), the value Q can be set within the SSR DDS 320. Alternatively, as noted above, the value Q can be set by the cancellation processor 303 (see FIG. 3). In this embodiment, the value Q is provided through the input port 310. The clock coupled to the SSR DDS 302 through input port 308 is coupled to the counter 422 and to the register 424.

The register 424 is initialized to zero. Also, since the wrap0 value is zero, the delta value output from the tracking logic 414 will be zero. Therefore, in the first cycle of the clock, the value of Q will be coupled from the output of the second summer 420 to the input of the counter 422. This value is then coupled to the input of the register 424. Each subsequent clock cycle, the value coupled to the counter 422 will increase by Q, until the wrap0 goes to a value of one. When the wrap0 goes to a value of one, the delta output 426 output from the tracking logic 414 will go to one. Thus, the first summer 418 will output a value of Q plus one. This, in turn, increases the value coupled to the input to the counter 422 by one. Increasing the input to the counter 422 will advance the phase of the output of the register 424. The wrap0 output 412 from the counter 406 of the tracking logic 402 will remain high for one cycle each time the counter 406 wraps around (i.e., exceeds M). However, the delta output 426 of the tracking logic will remain high until the wrap1 output from the counter 422 goes to a one.

The output of the register 422 is a series of values that ramp from 0 to x at the frequency of the spurious signal to be cancelled. A summer 428 adds a phase offset provided by a signal coupled through the port 314. By setting the phase of the signal output from the register 424, the signal can be phase aligned to be 180 degrees out of phase with an interfering signal to be cancelled. A look-up table (LUT) 434 converts the value output from the summer 428 to a value that digitally traces a sinusoidal output signal. That is, for each value output from the summer 428, the LUT 434 cross references to a value that represents an amplitude of a sinusoidal signal at which the phase of the sinusoidal signal is represented by the magnitude of the output of the summer 428. Accordingly, the LUT 434 converts a digital representation of a sawtooth wave to a digital representation of a sinusoidal wave. It should be noted that "sinusoidal" should include waves that follow the cosine as well.

Figure 5:
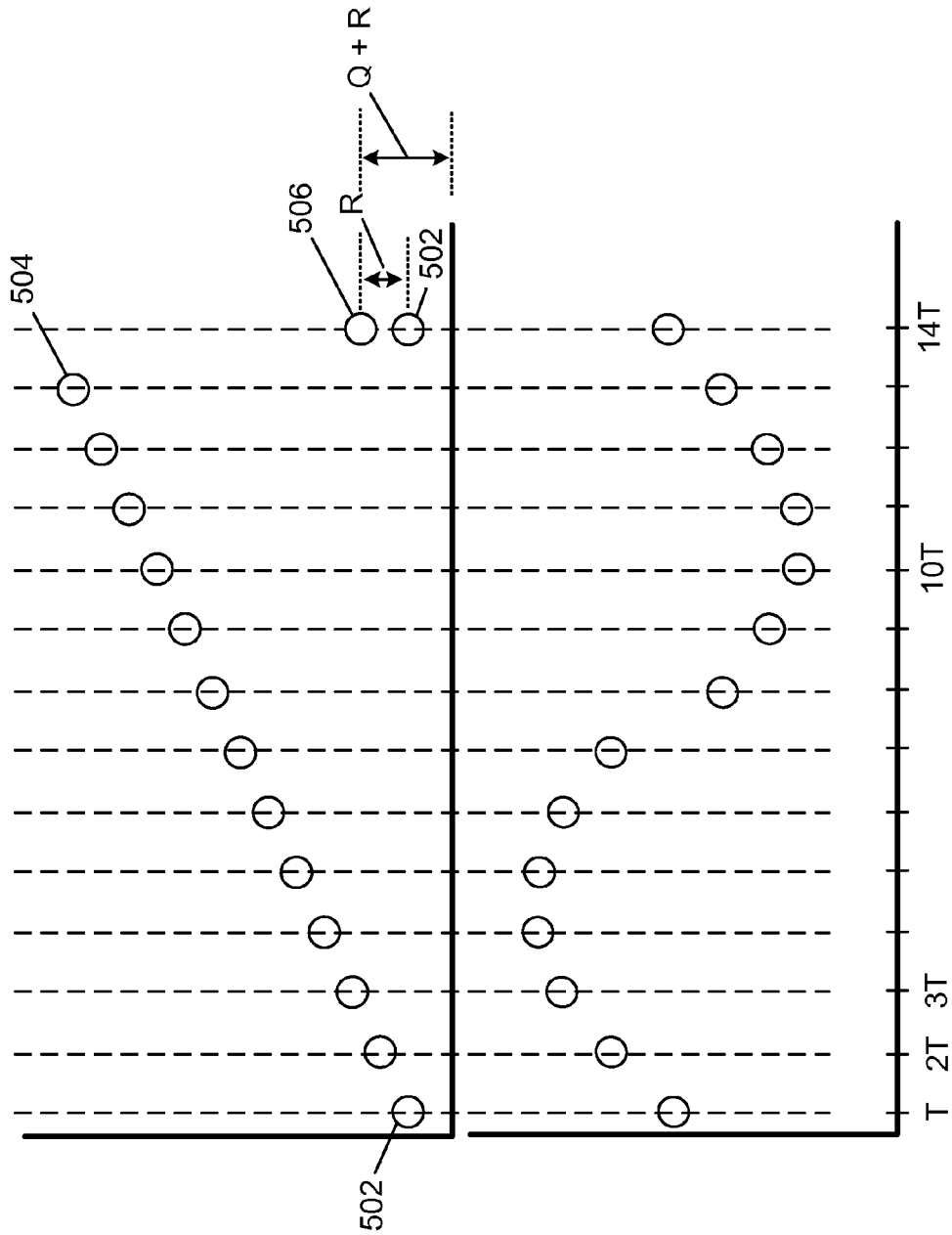
FIG. 5 is an illustration of the output of a summer of FIG. 4 and the respective output from the LUT of FIG. 4.

FIG. 5 is an illustration of the output of the summer 428 and the respective output from the LUT 434. There are 13 points shown starting at an initial value 502 of Q. The magnitude of each point increases in steps of equal size (i.e., steps of size Q) up to a full-scale value 504 ((M/N*Q)=$2^{29}$). At that point, the value output from the counter 422 wraps and the magnitude of the output goes back to Q at point 502, assuming N/M*$2^{29}$=floor (N/M*$2^{29}$). If N/M*$2^{29}$ is not an integer, then there will be a remainder left in the register 424. The remainder will be added to the first value of Q. Therefore, after the counter 422 wraps, the value 506 will be Q+R, where R is the remainder (N/M*$2^{29}$)–(floor(N/M*$2^{29}$))=R. It should be noted that the scale of R shown in FIG. 5 is not accurate due to the relatively large actual magnitude of R and Q. That is, R is shown in FIG. 5 to be greater than Q. However, this cannot be the case, but is illustrated as such to exaggerate the value of R to make it possible to illustrate R. Were R shown to proper scale with respect to Q, it would be some value less than Q and equal to MOD (N/M).

In the example shown in FIG. 5 in which $2^x=2^{29}$, there are $2^{29}$ values in the LUT 434. In the example in which the M/N=13, there are 13 points between the value Q at point 502 and the maximum value 504 at time 13 T. It should be understood that the value M/N=13 is selected purely arbitrarily for the purpose of illustrating the presently disclosed method and apparatus with a particular example. In this case, the frequency of the spurious signal to be cancelled would be the clock frequency divided by 13. Therefore, in accordance with one embodiment of the disclosed method and apparatus, the phase of the output at time tT=t*(N/M)*360 degrees. Accordingly, the value output from the LUT 434 will be $2^{29}$*sin ($2\pi$*t*(N/M)). Once the value of the LUT output is determined, a multiplier 436 will determine the amplitude of the output of the SSR DDS 302. That is, the gain signal input via input port 312 is multiplied by the output of the LUT 434 in the summer 436 to set the gain for the signal and generate the final digital signal output on port 316. The output is then provided to the summer 306 (see FIG. 3).

Figure 6:
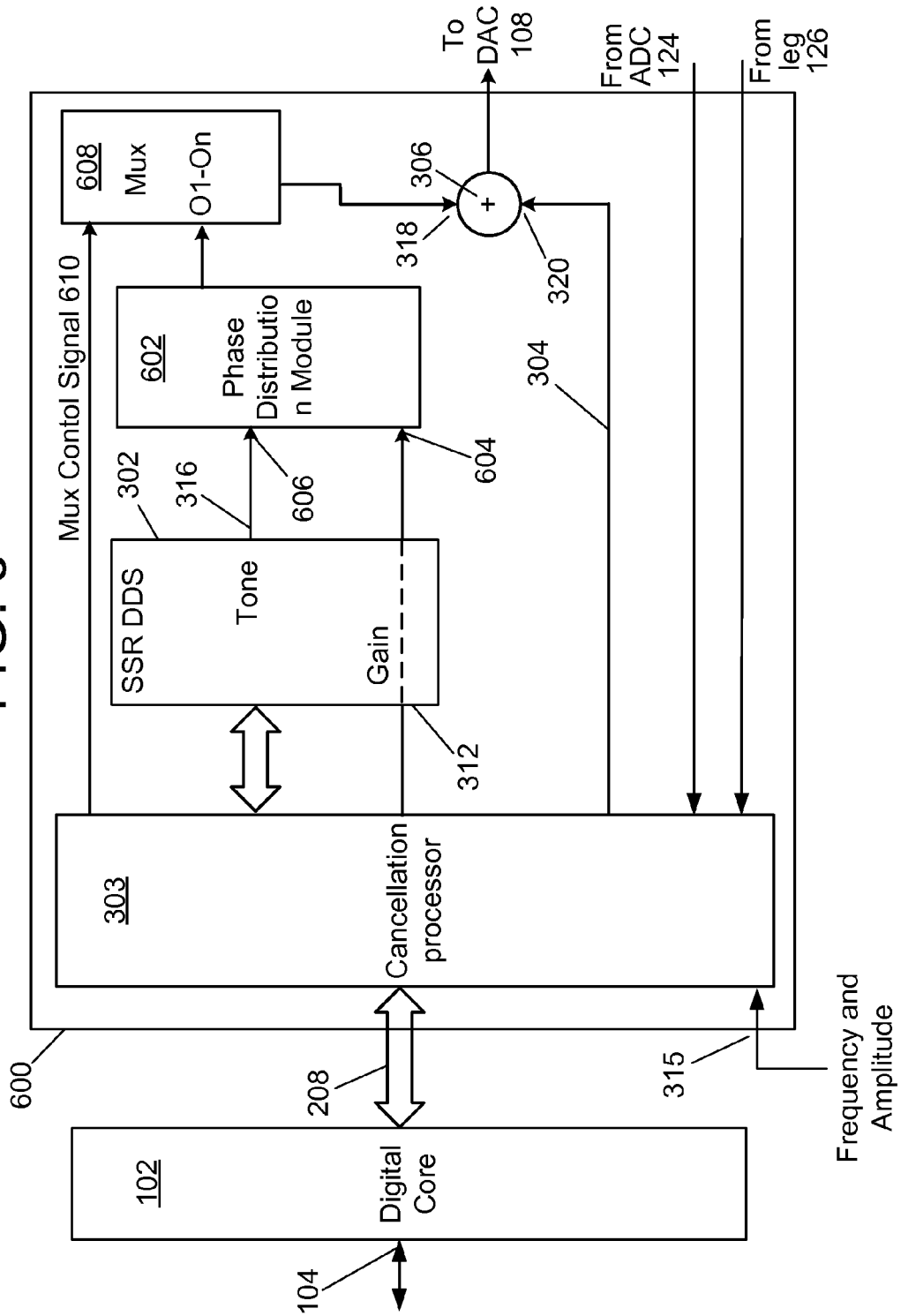
FIG. 6 illustrates another embodiment of an SoC having an SSR DDS coupled to a phase distribution module in accordance with the disclosed method and apparatus.

FIG. 6 illustrates another embodiment of an SoC having a spurious mitigation module 600. The spurious mitigation module 600 has an SSR DDS 302 coupled to a phase distribution module 602 in accordance with the disclosed method and apparatus. The SSR DDS 302 is identical to that shown in FIG. 4. However, the gain signal coupled from the cancellation processor 303 to the input port 312 is coupled through the SSR DDS 320 to an input port 604 to the phase distribution module 602. Furthermore, the output from the SSR DDS 302 is taken from the summer 428. The output of the summer 428 is coupled to an output port 317. The output port 317 is coupled to an input port 606 in the phase distribution module 602. The output of the phase distribution module 602 is coupled to a multiplexer 608. A multiplexer control signal 610 controls the multiplexing of the signals output from the phase distribution module 602, as will be discussed in further detail below.

Figure 7:
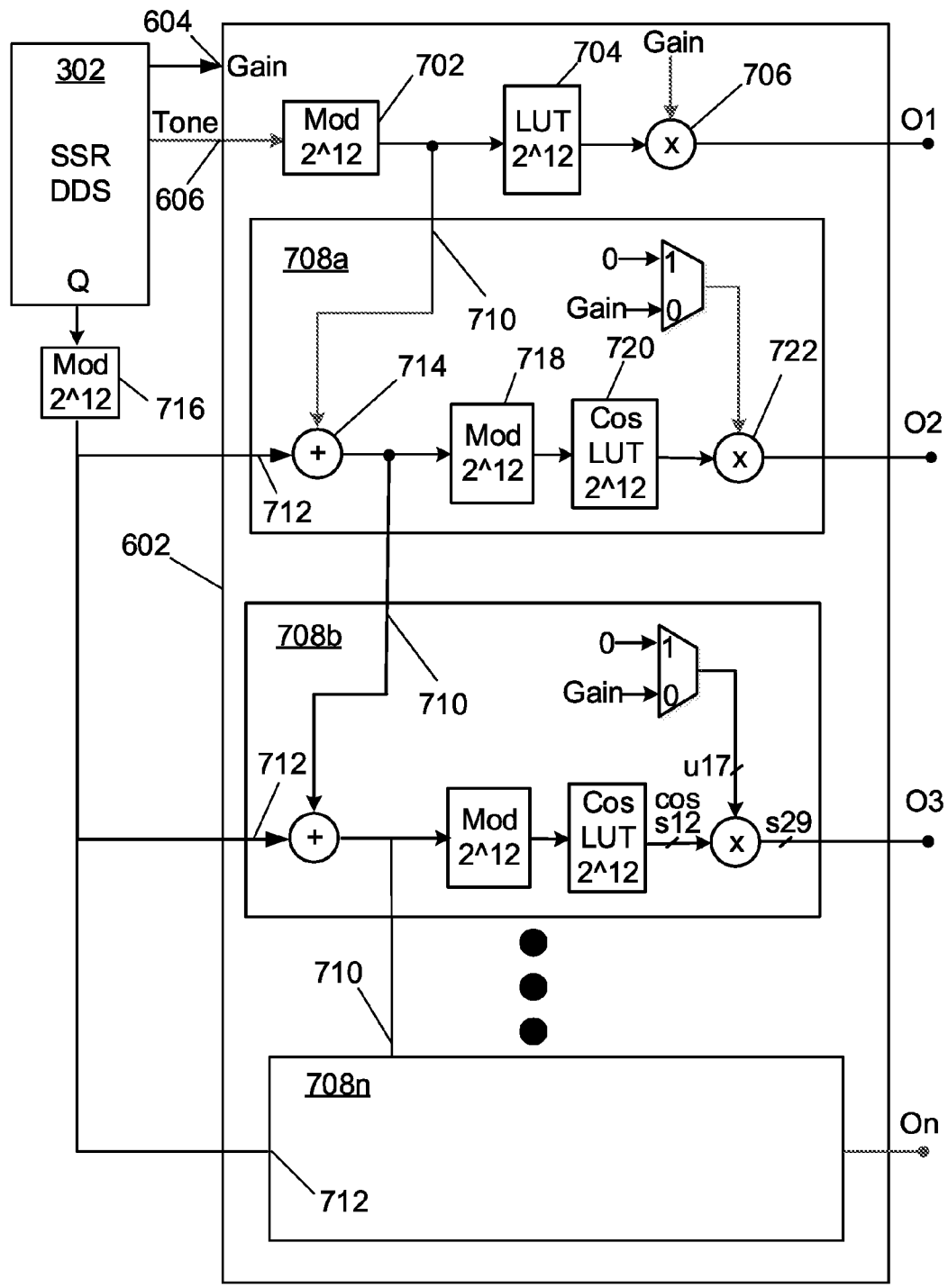
FIG. 7 is a more detailed schematic of a Phase Distribution module.

FIG. 7 is a more detailed schematic of the phase distribution module 602. The tone received on the input port 606 is coupled to a modulo-$2^{12}$ module 702. The module 702 divides the frequency of the signal by $2^{12}$. The output of the module 702 is then coupled to a LUT 704 that converts a digital representation of the sawtooth output from the SSR DDS 302 into a digital representation of a sinusoidal waveform, as described above with respect to FIG. 5. It should be noted that the input to the module 702 is a 29-bit value. The output from the module 702 is a 12-bit value. The output of the LUT 704 is coupled to a first input to a multiplier 706. The second input to the multiplier 706 is coupled to the gain signal received through the input port 604 from the SSR DDS 302. The multiplier 706 applies the gain as controlled by the cancellation processor 303. The output of the multiplier 706 is coupled to the multiplexer 608 (see FIG. 6 and FIG. 8).

The output of the module 702 is also coupled to the input of a first one of several phase branches 708. Each phase branch 708a, 708b . . . 708n is identical. Therefore, only one such phase branch 708 is discussed in detail herein. The outputs of each phase branch 708 are multiplexed together in the multiplexer 608 as will be described below with respect to FIG. 8.

Each phase branch 708 has a first input 710 and a second input 712. The first input 710 of the first phase branch 708a is coupled to the output of the module 702. This input 710 is also coupled to the first input to a summer 714. A second input to the summer 714 is coupled to the output of a Modulo-$2^{12}$ module 716. The input of the module 716 is coupled to the SSR DDS 302 and receives the value Q. Accordingly, the summer 714 offsets the phase of the output of the module 716 by an amount equal to 360*1/n, wherein n is the number of phase branches. That is, in the example shown in FIGS. 6-8, there are 8 phase branches. Therefore, by dividing Q by $2^{20}$, and offsetting each phase branch by a multiple of $2^{20}$, 8 equally divided phase branches can be interleaved and then multiplexed together in the multiplexer 608. In the case of the phase section 708a, the output of the module 702 is offset in phase by Q/$2^{20}$. The phase offset output from the summer 714 is coupled to a modulo-$2^{12}$ module 718. The modulo-$2^{12}$ module 718 divides the frequency of the output from the summer 714 by $2^{12}$. The output of the module 718 is then coupled to the input of a $2^{12}$ LUT 720. The LUT 720 converts the digital sawtooth input to a digitized sinusoidal output that is then gain controlled by a multiplier 722. The multiplier can either multiple the LUT output by the gain, or selectively, as controlled by the cancellation processor 303, select to disable the phase branch 708a by multiplying the output of the LUT 720 by zero. A multiplexer 724 selects between the gain input and the zero input to the multiplier 722. The output of the phase branch 708a is coupled to the multiplexer 608 (see FIG. 6).

Each additional phase branch 708b . . . 708n receives the first input 710 from the output of the summer 714 in the previous phase branch. For example, the first input 710 to the phase branch 708b is coupled to the output of the summer 714 of the phase branch 708a. The second input to each phase branch 708 is coupled to the output of the module 716. Accordingly, each phase branch will output a sinusoidal signal (or cosine signal) that is equally spaced in phase and that can be multiplexed in the multiplexer 608 to create the full frequency signal at the frequency of the spurious signal to be cancelled (i.e., N/M*CLK).

FIG. 8 is a simplified block diagram of the multiplexer 608. Each of the signals output from the respective phase branches 708 of the phase distribution module 602 are coupled to the respective inputs of an n to 1 multiplexer 802. The output of the multiplexer 802 is a digital signal having a frequency equal to the frequency of the spurious signal selected for cancellation by the cancellation processor 303. In one embodiment of the presently disclosed method and apparatus, a summer 804 within the multiplexer 608 can sum together multiple tones, each generated by a unique pair of SSR DDS 302 and phase distribution 602 modules. In this way, more than one spurious signal can be cancelled within the transceiver 200. In accordance with one embodiment, the number of bits to be applied to the DAC 108 (see FIG. 2) is reduced by a truncation module 806.

Although the disclosed method and apparatus is described above in terms of various examples of embodiments and implementations, it should be understood that the particular features, aspects and functionality described in one or more of the individual embodiments are not limited in their applicability to the particular embodiment with which they are described. Thus, the breadth and scope of the claimed invention should not be limited by any of the examples provided in describing the above disclosed embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A spurious signal rejection (SSR) direct digital synthesizer (DDS) comprising:
   a) a first DDS circuit comprising:
      i) a first summer having a first input and a second input and an output, the first input coupled to a source of a value N;
      ii) a modulo-M counter having a first input, a second input and a third input and a first output and a second output, the first input of the modulo-M counter coupled to the output of the first summer, the second input of the modulo-M counter coupled to a source of a value M and the third input of the modulo-M counter coupled to a source of a clock; and
      iii) a first register having an first input and second input and an output, the first input coupled to the first output of the first modulo-M counter, the second input coupled to the source of the clock and the output of the first register coupled to the second input of the first summer;
   b) a second DDS circuit comprising:
      i) a second summer having a first input and a second input and an output, the first input of the second summer coupled to a source of a value Q, wherein the value Q is equal to floor ((N/M)*Y);
      ii) a third summer having a first input and a second input and an output, the first input of the third summer being coupled to the output of the second summer;
      iii) a modulo-Y counter having a first input and a second input and a first output and a second output, the first input of the modulo-Y counter coupled to the output of the third summer and the second input of the modulo-Y counter coupled to the source of the clock; and
      iv) a second register having a first input and a second input and an output, the first input of the second register coupled to the first output of the modulo-Y counter, the second input of the second register coupled to the source of the clock, the output of the second register coupled to the second input of the third summer; and
   c) a tracking logic module having a first input and a second input and an output, the first input of the tracking logic module coupled to the second output of the first modulo-M counter, the second input of the tracking logic module coupled to the second output of the modulo-Y counter, the output of the tracking logic module being 1 if the second output of the modulo-M counter is 1 and the second output of the modulo-Y counter is a zero, and the output of the tracking logic module otherwise being a zero if the second output of the modulo-M counter is a zero and the second output of the modulo-Y counter is 1.

2. The SSR DDS of claim 1, wherein Y is equal to $2^{29}$.

3. The SSR DDS of claim 2, further including a fourth summer having a first input and a second input and an output, the first input of the fourth summer coupled to the output of the second register, the second input of the fourth summer coupled to a source of an initial phase value and the output of the fourth summer coupled to the input of the look-up table.

4. The SSR DDS of claim 3, further including a fifth summer having a first input and a second input and an output, the first input of the fifth summer coupled to the output of the look-up table and the second input of the fifth summer coupled to a source of a gain control signal and the output providing a digital output.

5. The SSR DDS of claim 1, further including a look-up table having an input and an output, the look-up table having stored therein values that will convert digital values output from the second register to digital values representing a sinusoidal wave, the input of the look-up table coupled to the output of the second register.

6. A system on a chip having a digital core coupled to a spurious signal mitigation module, the spurious signal mitigation module comprising:
   a) a cancellation processor having a first output, a second output, a third output and a fourth output; and
   b) an SSR DDS comprising:
      i) a first DDS circuit comprising:
         1) a first summer having a first input and a second input and an output, the first input of the first summer coupled to the first output of the cancellation processor for receiving a value N;
         2) a modulo-M counter having a first input, a second input and a third input and a first output and a second output, the first input of the modulo-M counter coupled to the output of the first summer, the second input of the modulo-M counter coupled to the second output of the cancellation processor for receiving a value M and the third input of the modulo-M counter coupled to the third output of the cancellation processor for receiving a clock signal; and
         3) a first register having an first input and a second input and an output, the first input of the first register coupled to the first output of the first modulo-M counter, the second input of the first register coupled to the third output of the cancellation processor and the output of the first register coupled to the second input of the first summer;
      ii) a second DDS circuit comprising:
         1) a second summer having a first input and a second input and an output, the first input of the second summer coupled to the fourth output of the cancellation processor for receiving a value Q, wherein the value Q is equal to floor((N/M)*Y);
         2) a third summer having a first input and a second input and an output, the first input of the third summer being coupled to the output of the second summer;
         3) a modulo-Y counter having a first input and a second input and a first output and a second output, the first input of the modulo-Y counter coupled to the output of the third summer and the second input of the modulo-Y counter coupled to third output of the cancellation processor; and
         4) a second register having a first input and a second input and an output, the first input of the second register coupled to the first output of the modulo-Y counter, the second input of the second register coupled to the third output of the cancellation processor, the output of the second register coupled to the second input of the third summer; and
         iii) a tracking logic module having a first input and a second input and an output, the first input of the tracking logic module coupled to the second output of the first modulo-M counter, the second input of the tracking logic module coupled to the second output of the modulo-Y counter, the output of the tracking logic module being 1 if the second output of the modulo-M counter is 1 and the second output of the modulo-Y counter is a zero, and the output of the tracking logic module otherwise being a zero if the second output of the modulo-M counter is a zero and the second output of the modulo-Y counter is 1.

7. The SoC of claim 6, the SSR DDS further comprising a look-up table having values stored therein for converting the output of the second register to a digital representation of a sinusoidal wave.

8. The SoC of claim 6, wherein the output of the second register is a sawtooth wave.

9. The SoC of claim 6, the spurious mitigation module further comprising a modulo-R module having an input coupled to the SSR DDS for receiving the value Q, an output, and further comprising a phase distribution module comprising:
   a) a first modulo-Z module having an input coupled to the output of the fourth summer and an output;
   b) a look-up table having an input coupled to the output of the first modulo-Z module and an output;
   c) a first phase branch comprising:
      i) a fourth summer having a first input and a second input and an output, the first input of the fourth summer coupled to the output of the first modulo-Z module and the second input of the fourth summer coupled to the output of the modulo-R module;
      ii) a second modulo-Z module having an input coupled to the output of the fourth summer and an output; and
      iii) a second look-up table having an input coupled to the output of the second modulo-Z module and an output; and
   d) at least one additional phase branch comprising;
      i) an additional summer having a first input and a second input and an output, the first input of the additional summer coupled to the output of the summer of a preceding phase branch and the second input of the additional summer coupled to the output of the modulo-R module;
      ii) an additional modulo-Z module having an input coupled to the output of the additional summer and an output; and
      iii) an additional look-up table having an input coupled to the output of the additional modulo-Z module and an output.

10. A method for generating a signal to be used to cancel an interfering signal comprising:
    a) determining a first value N;
    b) determining a second value M;
    c) receiving a clock having a clock frequency, where the clock frequency times the quotient of N divided by M is the frequency of an interfering signal to be cancelled;

d) incrementing a modulo-M counter by N for each clock cycle and outputting a wrap signal each time the modulo-M counter reaches M and wraps around;
e) receiving a value Q equal to floor ((N/M)*Y); and
f) incrementing a modulo-Y counter by the value Q for each clock cycle that the modulo-M counter has not wrapped around and once the modulo-M counter has wrapped around, incrementing the modulo-Y counter by Q plus 1 until the modulo-Y counter wraps around.

11. The method of claim 10, further including summing the output of the modulo-Y counter with a value selected to set the phase for the interference cancelling signal to be 180 degrees output of phase with the interfering signal.

12. The method of claim 11, further including cross referencing the digital values resulting from the summing to digital values that digitally trace a sinusoidal output signal.

13. The method of claim 12, further including multiplying the digitally traced sinusoidal output by a gain value.

14. The method of claim 10, further including interleaving the output of the modulo-Y counter using a plurality of phase branches.

\* \* \* \* \*